United States Patent [19]
Shimizu

[11] Patent Number: 5,943,277
[45] Date of Patent: Aug. 24, 1999

[54] APPARATUS AND METHOD FOR RECOGNIZING THE STATE OF CONNECTION OF TERMINALS

[75] Inventor: Naoki Shimizu, Kawasaki, Japan

[73] Assignee: Fujitsu Limited, Kawasaki, Japan

[21] Appl. No.: 09/182,234

[22] Filed: Oct. 30, 1998

[30] Foreign Application Priority Data

Dec. 2, 1997 [JP] Japan ..................................... 9-331914

[51] Int. Cl.⁶ ................................................. G11C 29/00
[52] U.S. Cl. ..................................... 365/201; 365/185.33
[58] Field of Search .............................. 365/185.33, 201; 371/21.1, 21.2

[56] References Cited

U.S. PATENT DOCUMENTS 5,771,191  6/1998  Matsue ................................ 365/185.09
5,812,472  9/1998  Lawrence et al. ....................... 365/201

*Primary Examiner*—Vu A. Le
*Attorney, Agent, or Firm*—Nikaido, Marmelstein, Murray & Oram LLP

[57] ABSTRACT

An apparatus for recognizing the state of connection of terminals by recognizing the connection state of a plurality of terminals of a memory device including a non-volatile memory unit, such as a flash memory, comprises a data storage unit disposed inside the memory device, for storing connection state recognition data necessary for recognizing a connection state of a plurality of terminals of the memory device including the non-volatile memory unit, disposed inside the memory device; a switching control unit having the function of switching the current state to the state for outputting the connection state recognition data between the non-volatile memory unit and the data storage unit; and a data detecting unit for detecting the connection state recognition data outputted from the switching control unit, and confirming whether or not there is any connection fault of a plurality of terminals on the basis of the connection state recognition data which is detected by the data detecting unit. A method for recognizing the state of connection of terminals, in which the connection fault of a plurality of terminals of a memory device is detected by using the connection state recognizing apparatus described above, is also disclosed.

11 Claims, 7 Drawing Sheets

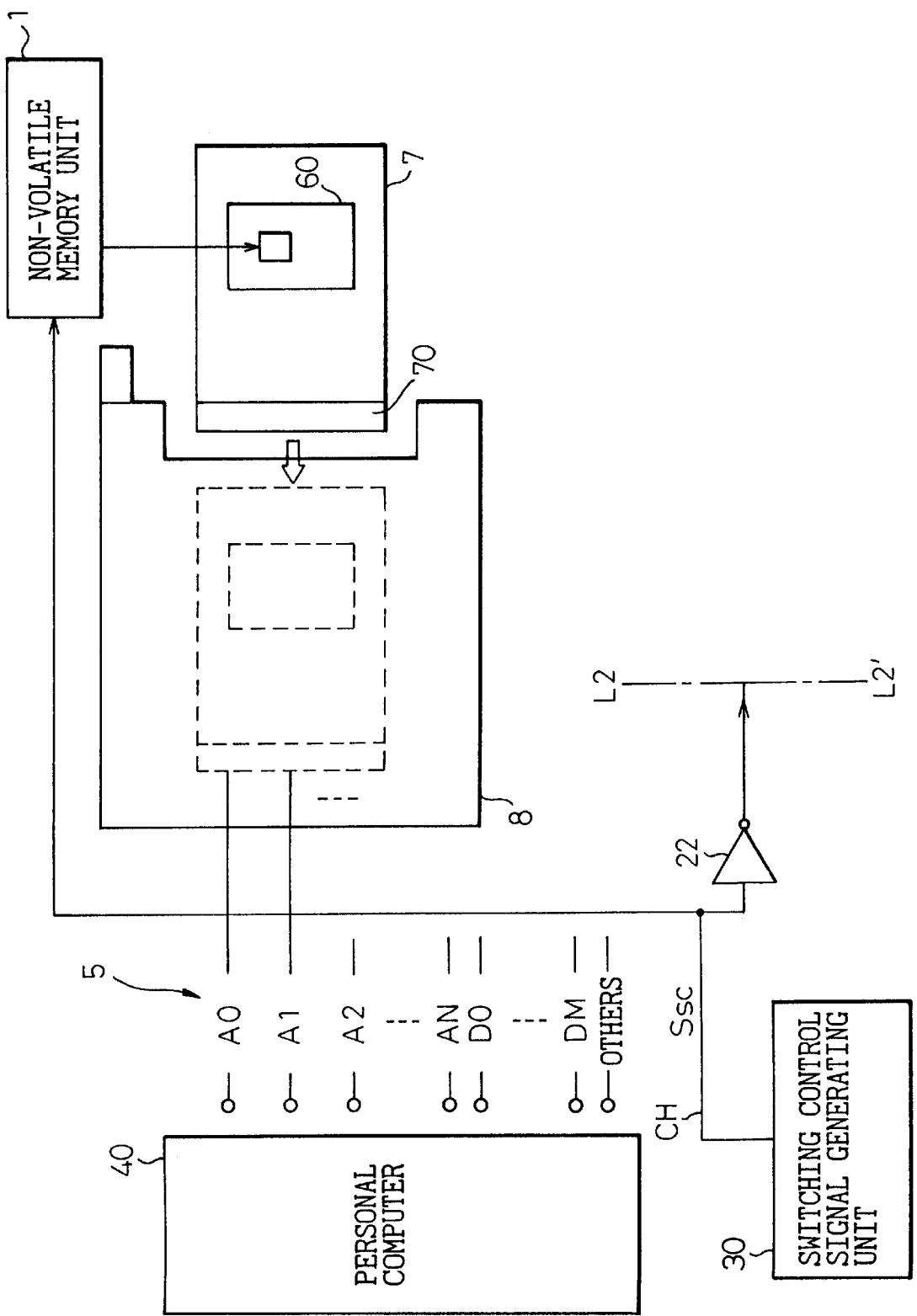

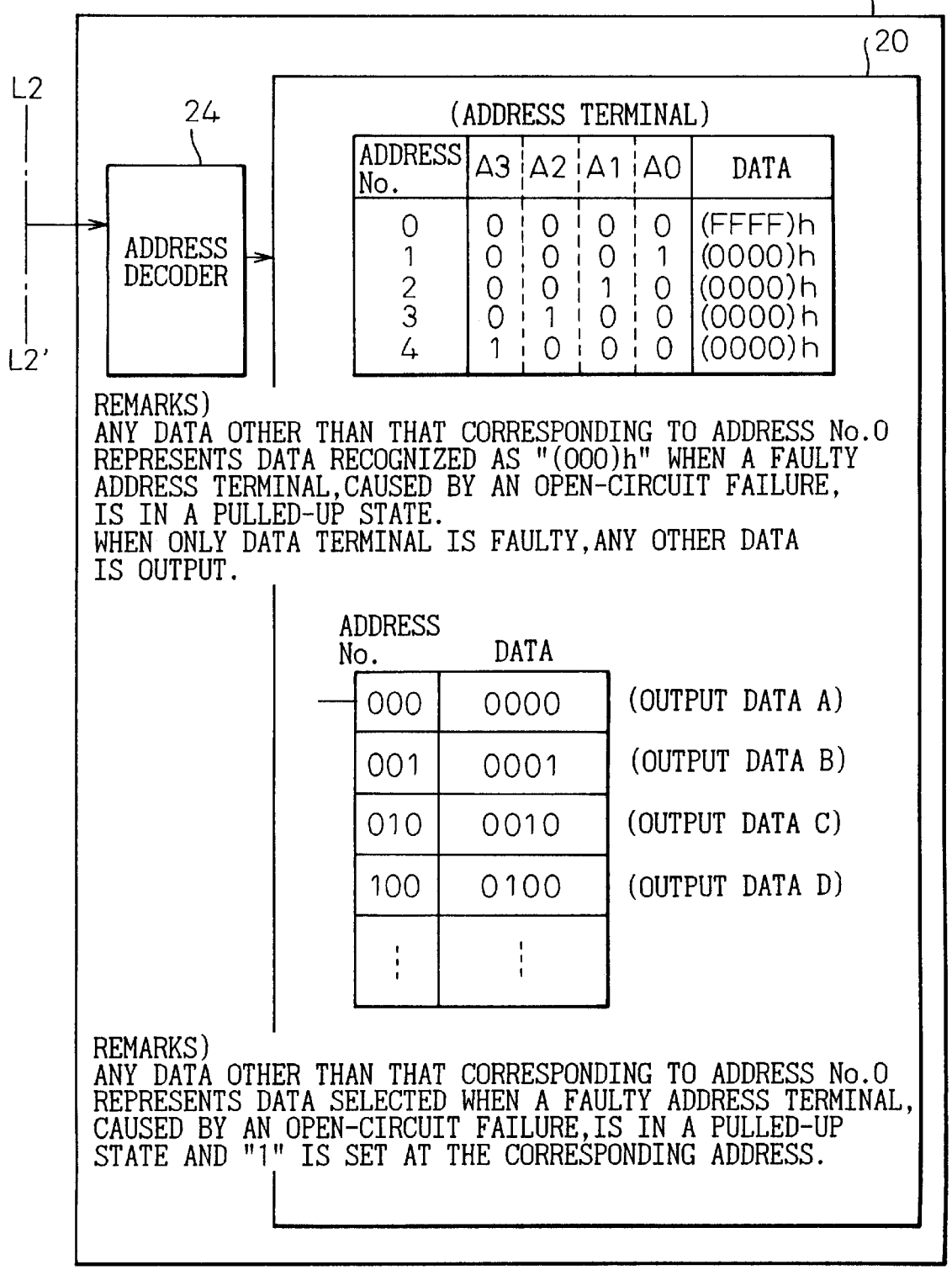

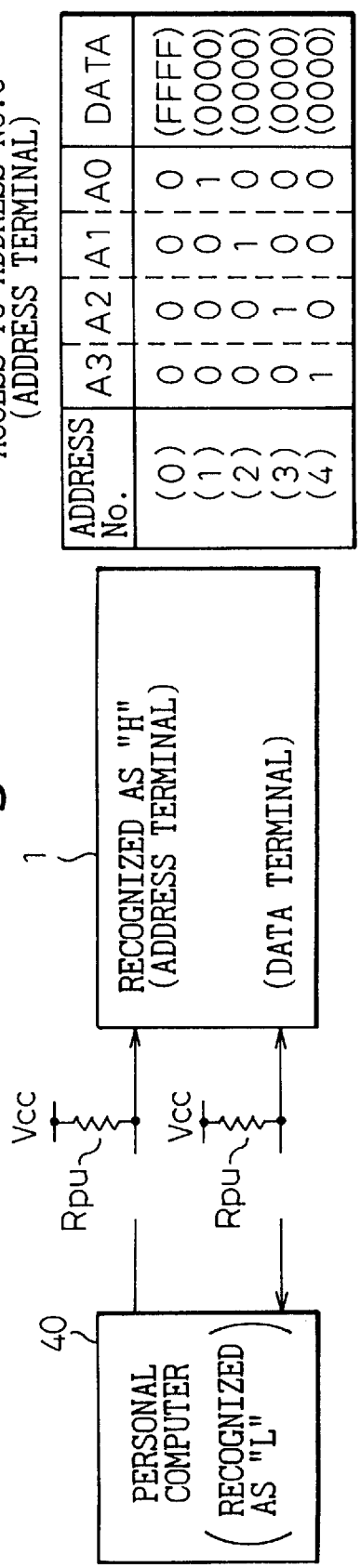
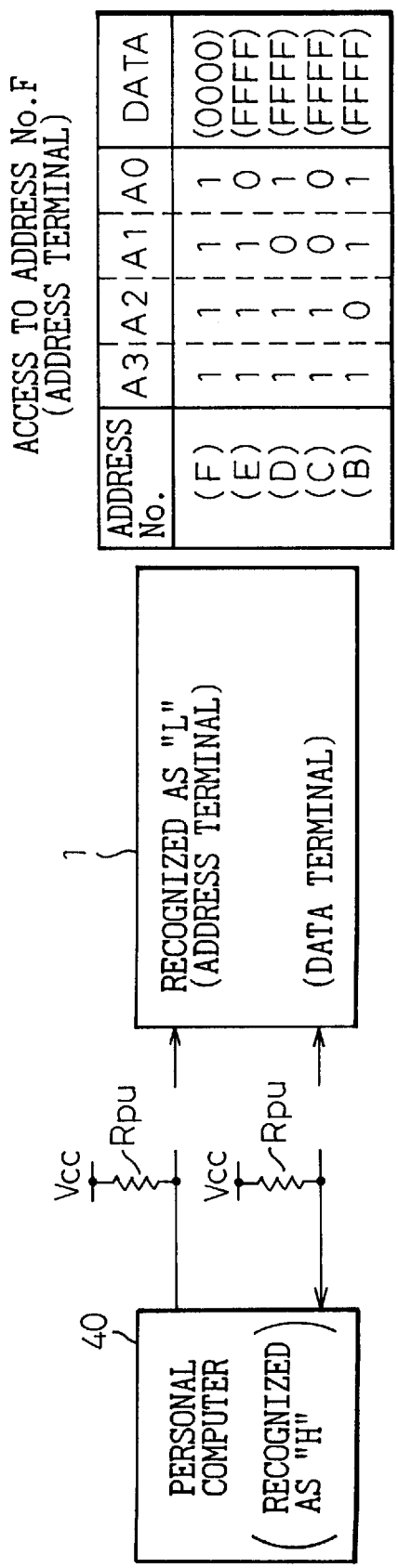

APPARATUS AND METHOD FOR RECOGNIZING THE STATE OF CONNECTION OF TERMINALS

BACKGROUND OF THE INVENTION

1. Field of the Invention

This invention relates to an apparatus and a method for recognizing the state of connection of terminals, for recognizing the connection state of a plurality of terminals of a memory device having a non-volatile memory unit (or non-volatile memory), such as a flash memory mounted thereto, and for detecting a fault concerning the connection of the terminals, i.e., connection fault of the terminals.

In computer systems in general, including personal computers, a memory device having a non-volatile memory unit, such as a flash memory, mounted thereto, for example, a small size memory card, is used in computer systems while the memory card is assembled into an adapter of an industrial standard form and the adapter is inserted into a socket portion used for the personal computer, etc. To confirm the state of connection of a plurality of terminals extended from the memory card with the socket portion, it is customary to test the state of connection between a plurality of terminals and the socket portion by using a measuring instrument such as a tester to detect any connection fault of the terminals, before the computer systems, including personal computers, etc, are shipped as products. It is desirable, however, that the state of connection of terminals can be tested even in an environment in which a measuring instrument such as a tester is not available, e.g., an environment in which a user carries out a test after the shipment of the products, in order to prevent an erroneous operation of the computer systems resulting from the faulty connection of address terminals, data terminals, and so forth.

The present invention provides a technique for easily detecting a connection fault, such as a short-circuit and an open fault at a part or parts of address terminals, data terminals, and so forth, even in the environment in which a measuring instrument such as a tester is not available. However, the above technique is based on the premise that read operations can be normally carried out from the memory card.

2. Description of the Related Art

In order to make the problem with the conventional method for recognizing the state of connection of terminals more easily understood, a method for detecting the connection fault of terminals of a memory card according to the prior art will be explained with reference to FIGS. 1 and 2 that will be described later in "Brief Description of The Drawings".

In FIG. 1, a plan view showing a general shape of an adaptor having a memory card mounted thereto is illustrated. In FIG. 2, a block diagram useful for explaining a conventional technique for recognizing the state of connection of terminals according to the prior art is illustrated.

To use a non-volatile memory unit 100, such as a flash memory, for a computer system, a small size memory card 60 having this non-volatile memory unit 100 mounted thereto is assembled ordinarily into an adapter 7 of an industrial standard form, as shown in FIG. 1. A plurality of terminals 5 (see FIG. 2) extended from the memory card 60 are formed at a connector portion 70 at an end portion of this adapter 7. These terminals include address terminals A0 to AN (where N is an arbitrary positive integer), data terminals D0 to DM (where M is an arbitrary positive integer such as M=15), control terminals and other terminals. Further, a plurality of terminals of the connector portion 70 are connected to the socket portion 8 when the adapter 7 is inserted into the socket portion 8 (see FIG. 2) for a personal computer, etc. Generally, however, the non-volatile memory unit 100 is of a fit-in type such that the memory unit 100 is fitted into the memory card 60, and the connector portion 70 might be worn out. Therefore, there might be the case in which all of the terminals of the connector portion 70 are not always perfectly connected to the socket portion 8.

Conventionally, the state of connection of the terminals has been recognized by testing a connection state between a plurality of terminals 5 of the connector portion 70 and the socket portion 8 by using a measuring instrument, such as a tester 400, and by writing exclusive test data that is prepared in advance, into a plurality of addresses inside the non-volatile memory unit 100. When this exclusive test data is written at the stage before shipment of the computer system including the personal computer, etc, as the product, that is, the stage before the use of the memory card 60 having the non-volatile memory unit 100 mounted thereto for the computer system, the test data can be erased after the test of the connection state of the terminals is completed and the data on the user side can be written into the non-volatile memory unit 100.

However, when the same test is to be carried out after shipment by using the exclusive test data, after the data of the non-volatile memory unit 100 inside the memory card 60 is expanded (i.e., transferred) to the computer system, i.e., when the state of connection of the terminals must be recognized after an erroneous operation has occurred inside the computer system due to wear of the connector portion 70, etc., the existing data that has already existed inside the non-volatile memory unit 100 must be rewritten so as to write the test data into a plurality of addresses. In other words, to confirm whether or not there is the connection fault in each of the address terminals A0 to AN, the data on the user side that is stored in the non-volatile memory unit 100 must be once erased and the test data must be then written afresh. On the other hand, to prevent the rewriting of the existing data inside the non-volatile memory unit 100, it is possible to employ a method in which this existing data is copied into other memory unit, but a large amount of memory capacity becomes necessary for copying this existing data.

It has therefore been difficult, according to the conventional method for recognizing the state of connection of terminals shown in FIG. 2, to easily confirm the connection state without using the exclusive test data, even when the connection state of the address terminals which are situated only as a part of a plurality of terminals of the memory card, is to be confirmed. In consequence, the problem occurs in that the existing data that has already existed inside the non-volatile memory unit of the memory card must be rewritten and the data on the user side is destroyed.

SUMMARY OF THE INVENTION

In view of the problem of the prior art described above, an object of the present invention is to provide an apparatus and a method for recognizing the state of connection of terminals which can easily and reliably detect a connection fault of a terminal or terminals among a plurality of terminals inclusive of address terminals and data terminals with the minimum necessary data memory areas, and without rewriting existing data of a non-volatile memory unit inside a memory device, such as a small size memory card.

When the state of connection of a plurality of terminals of a memory device having a non-volatile memory unit mounted thereto is recognized, an apparatus for recognizing the state of connection of terminals for accomplishing the object of the present invention described above comprises a data storage unit disposed inside the memory device, for storing connection state recognition data necessary for recognizing a connection state of a plurality of terminals; a switching control unit for switching the current state to the state for outputting the connection state recognition data between the non-volatile memory unit and the data storage unit; and a data detecting unit for detecting the connection state recognition data outputted from the switching control unit, and confirming whether or not there is any connection fault of a plurality of terminals on the basis of the connection state recognition data detected by the data detecting unit.

Preferably, in the apparatus for recognizing the state of connection of terminals according to the present invention described above, a predetermined one of the connection state recognition data is allowed in advance to be outputted to at least one of the first address and the final address, under the state in which a pull-up resistor is connected to each of the address terminals and the data terminals among a plurality of terminals. In this case, the terminal or terminals having the connection fault among the address terminals and the data terminals can be recognized, on the basis of the connection state recognition data, when the data detecting unit makes access to the first address or the final address when recognizing the connection state of a plurality of terminals.

Preferably, further, when the absence of the connection fault of the data terminals among a plurality of terminals is known in advance in the apparatus for recognizing the state of connection of terminals according to the present invention, mutually different connection state recognition data is allowed in advance to be outputted to areas corresponding to the addresses to which a specific attention is to be paid, under the state in which a pull-up resistor is connected to each of the address terminals among a plurality of terminals. In this case, the address terminal or address terminals having the connection fault can be specified, on the basis of the connection state recognition data, when the data detecting unit makes access to the first address or the final address.

Preferably, further, in the apparatus for recognizing the state of connection of terminals according to the present invention, predetermined connection state recognition data is allowed in advance to be outputted to at least one of the first address and the final address, under the state in which a pull-down resistor is connected to each of the address terminals and the data terminals among a plurality of terminals, or under the state in which no resistor is connected at all. In this case, the terminal or terminals having the connection fault among the address terminals and the data terminals can be recognized, on the basis of the connection state recognition data, when the data detecting unit makes access to the first address or the final address when recognizing the connection state of a plurality of terminals.

Preferably, further, when the absence of the connection fault of the data terminals among a plurality of terminals is known in advance in the apparatus for recognizing the state of connection of terminals according to the present invention, mutually different connection state recognition data is allowed in advance to be outputted to the areas corresponding to the addresses to which a specific attention is to be paid, under the state in which a pull-down resistor is connected to each of the address terminals among a plurality of terminals, or under the state in which no resistor is connected at all. In this case, the address terminal or address terminals having the connection fault can be specified, on the basis of the connection state recognition data, when the data detecting unit makes access to the first address or the final address.

When the state of connection of a plurality of terminals of a memory device having a non-volatile memory unit mounted thereto is recognized, on the other hand, a method for recognizing the state of connection of terminals according to the present invention includes the steps of disposing a data storage unit for storing connection state recognition data necessary for recognizing the connection state of a plurality of terminals inside the memory device; switching the current state to the state for outputting the connection state recognition data between the non-volatile memory unit and the data storage unit; and confirming whether or not there is any connection fault of a plurality of terminals on the basis of the connection state recognition data outputted under the above state.

Preferably, in the method for recognizing the state of connection according to the present invention described above, predetermined connection state recognition data is allowed in advance to be outputted to at least one of the first address and the final address, under the state in which a pull-up resistor is connected to each of the address terminals and the data terminals among a plurality of the terminals described above. In this case, the terminal or terminals having the connection fault among the address terminals and the data terminals can be recognized, on the basis of the connection state recognition data, by making access to the first address or the final address when the state of connection of a plurality of terminals is recognized.

Preferably, further, when the absence of the connection fault of the data terminals among a plurality of terminals is known in advance in the method for recognizing the state of connection of terminals according to the present invention, mutually different connection state recognition data is allowed in advance to be outputted to areas corresponding to the addresses to which a specific attention is to be paid, under the state in which a pull-up resistor is connected to each of the address terminals among a plurality of terminals. In this case, the address terminal or terminals having the connection fault can be specified, on the basis of the connection state recognition data, by making access to the first address or the final address.

Preferably, further, in the method for recognizing the state of connection of terminals according to the present invention, a predetermined one of the connection state recognition data is allowed in advance to be outputted to at least one of the first address and the final address, under the state in which a pull-down resistor is connected to each of the address terminals and the data terminals among a plurality of terminals, or under the state in which no resistor is connected at all. In this case, the terminal or terminals having the connection fault among the address terminals and the data terminals can be specified, on the basis of the connection state recognition data, by making access to the first address or the final address when the connection state of a plurality of terminals is recognized.

Preferably, further, when the absence of the connection fault of the data terminals among a plurality of terminals is known in advance in the method for recognizing the state of connection of terminals according to the present invention, mutually different connection state recognition data is allowed in advance to be outputted to areas corresponding to the addresses to which a specific attention is to be paid, under the state in which a pull-down resistor is connected to each of the address terminals among a plurality of terminals, or under the state in which no resistor is connected at all. In this case, the address terminal or address terminals having the connection fault can be specified, on the basis of the connection state recognition data, by making access to the first address or the final address.

On the other hand, a memory device associated with the apparatus for recognizing the state of connection of terminals according to the present invention, having a plurality of terminals and including a non-volatile memory mounted thereto, comprises a data storage unit disposed in the memory device, for storing data when testing a connection state of the plurality of said terminals; and a switching control unit having the function such that when testing, the switching control unit controls to connect the plurality of the terminals with the data storage unit, when non testing, the switching control unit controls to connect the plurality of the terminals with the non-volatile memory.

According to the apparatus and the method for recognizing the state of connection of terminals in the present invention, the data storage unit for storing in advance the connection state recognition data necessary for recognizing the connection state of a plurality of terminals of the memory device having the non-volatile memory unit mounted thereto, is disposed inside the memory device, and when it is confirmed that there is the connection fault of the terminals, external terminals, etc., are switched to change the connection state of the terminals so that the connection state recognition data inside the data storage unit can be accessed. In this way, the connection fault of a plurality of terminals inclusive of the address terminals and the data terminals can be reliably detected, without rewriting the existing data of the non-volatile memory unit inside the memory device, such as the small size memory card.

Particularly when the data of the first address (for example, data of 0 address) or the data of the final address in the connection state recognition data inside the data storage unit is allowed to be accessed, the connection fault of the address terminals and the data terminals among a plurality of terminals can be easily confirmed with the minimum necessary memory area. When it is confirmed that the connection fault has occurred in the address terminals and the data terminals as a result of the detection of the connection state recognition data of the first address (e.g., 0 address) or the final address, the memory device is connected again so that the existing data inside the non-volatile memory unit is outputted, or the address terminals and the data terminals are repaired. After such a process is carried out, the memory device inclusive of the non-volatile memory unit storing the existing data can be used once again.

BRIEF DESCRIPTION OF THE DRAWINGS

The above object and features of the present invention will be more apparent from the following description of the preferred embodiments with reference to the accompanying drawings, wherein:

FIG. 4 is a block diagram No. 1 showing a configuration of a preferred embodiment of the present invention;

FIG. 5 is a block diagram No. 2 showing a configuration of a preferred embodiment of the present invention;

FIGS. 6A and 6B are explanatory views useful for explaining an example of detecting an open fault when a pull-up resistor is connected to each terminal.

DESCRIPTION OF THE PREFERRED EMBODIMENTS

Hereinafter, preferred embodiments of the present invention will be explained with reference to FIGS. 3 to 7B.

Figure 3:
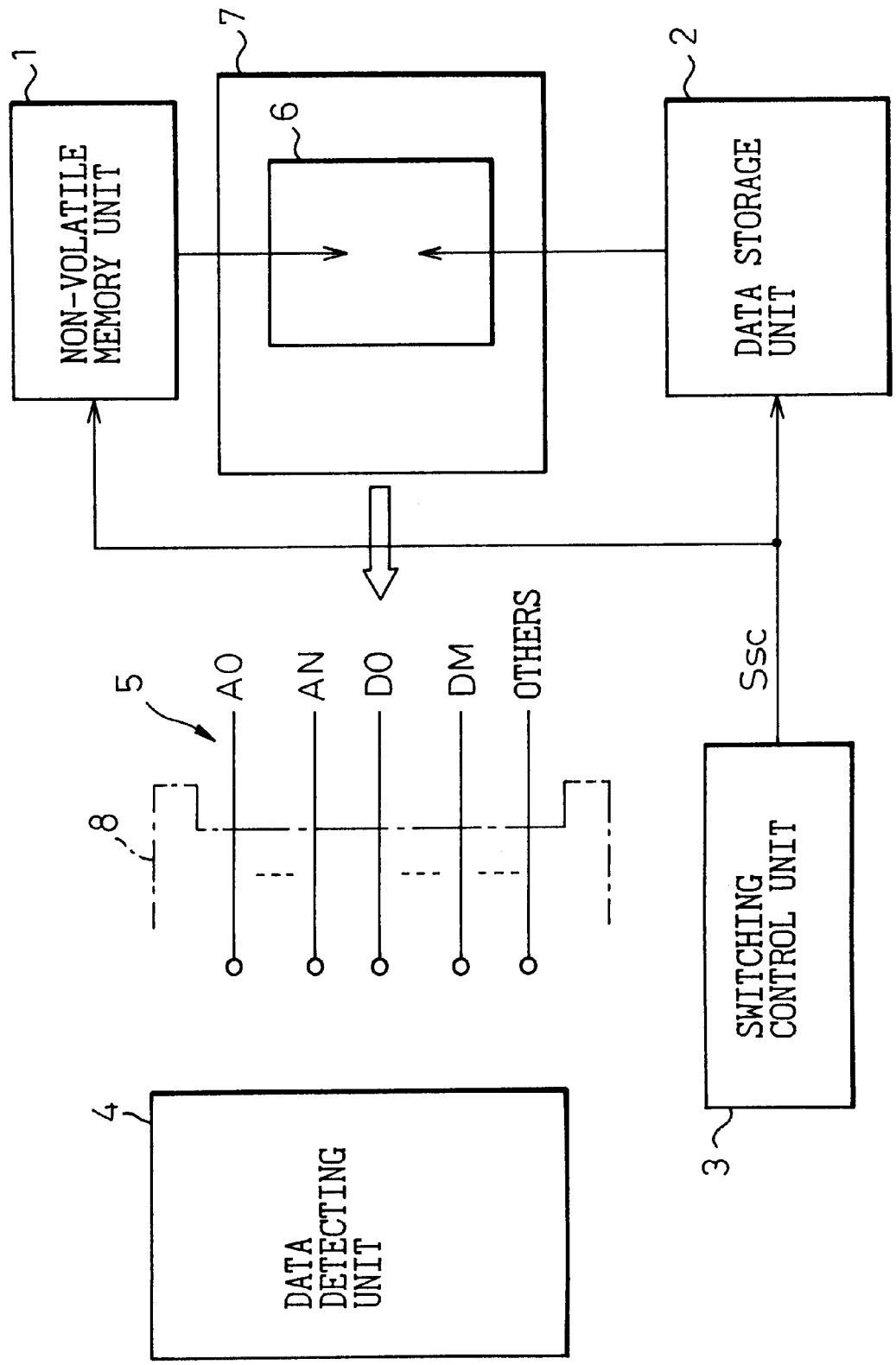
FIG. 3 is a block diagram showing a configuration of a basic embodiment based on the principle of the present invention.

FIG. 3 is a block diagram showing a configuration of a basic embodiment based on the principle of the present invention. Incidentally, like reference numerals will be used to identify like constituent elements that have already been explained.

Figure 1:
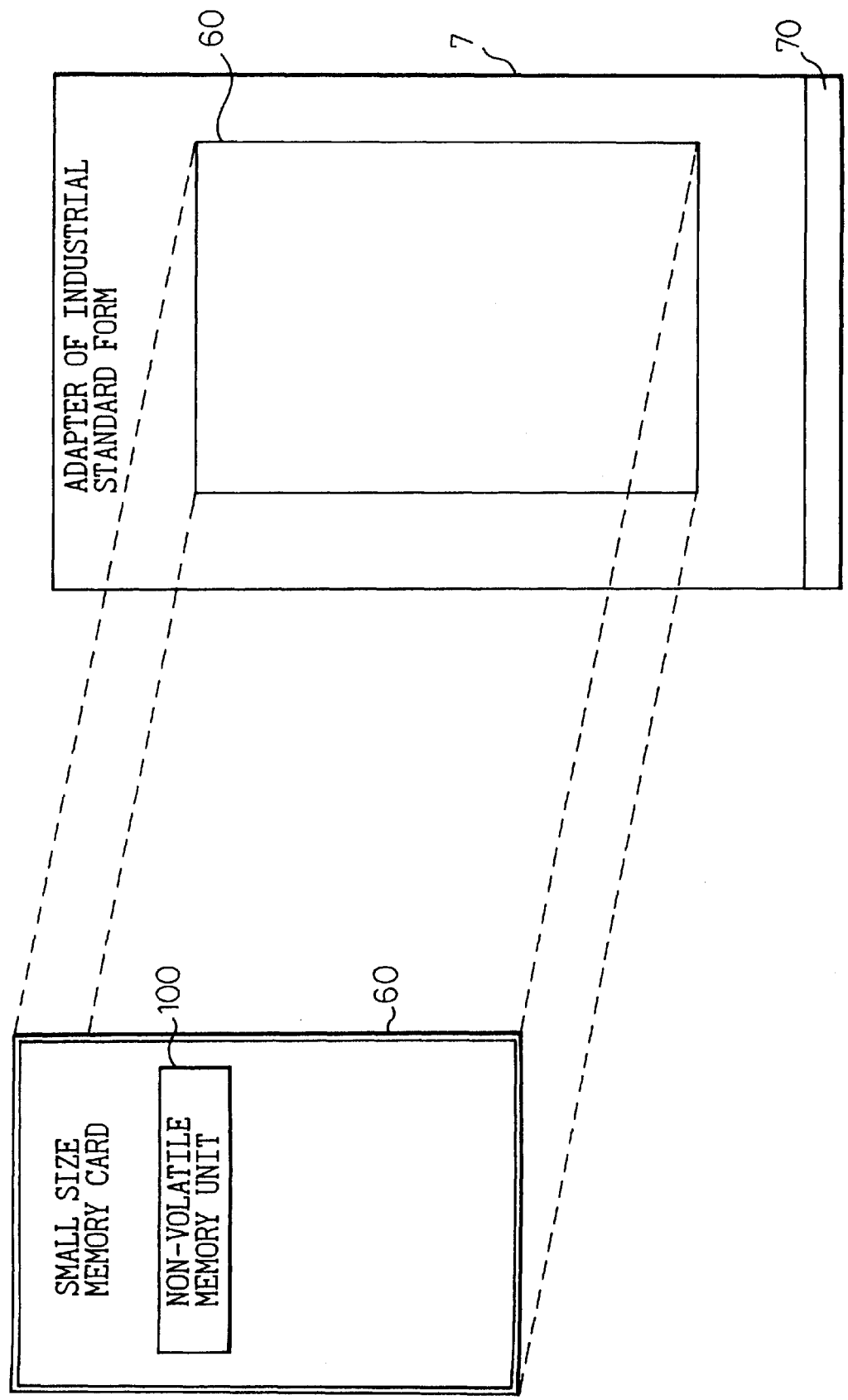
FIG. 1 is a plan view showing a general shape of an adapter having a memory card mounted thereto.
Figure 2:
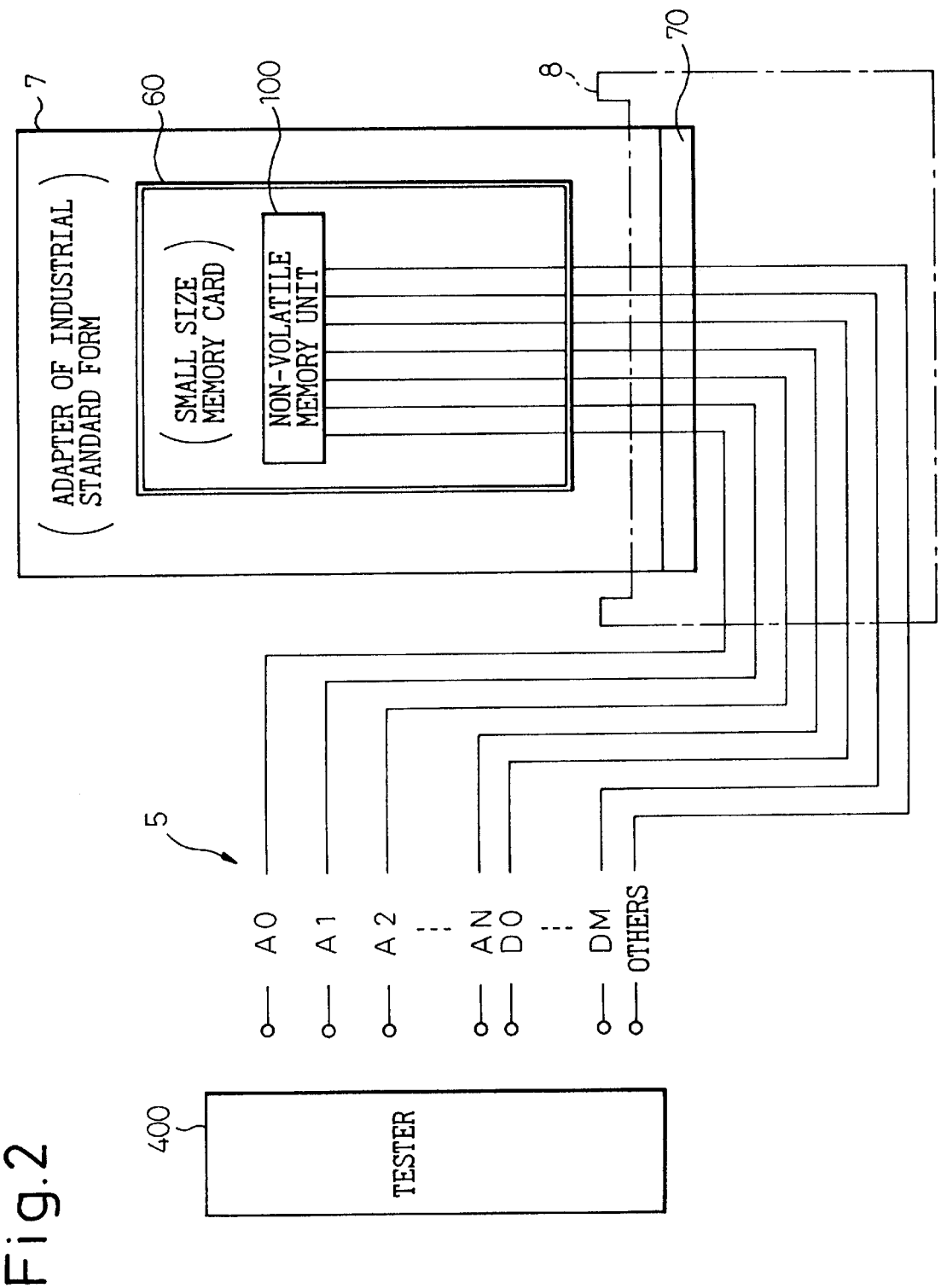
FIG. 2 is a block diagram useful for explaining a conventional technique for recognizing the state of connection of terminals.

Referring initially to FIG. 3, a non-volatile memory unit (or non-volatile memory) 1 for storing memory data, which is directly accessed from a host apparatus at the time of a write operation or a read operation, is mounted to a memory device 6, such as a small size memory card. This non-volatile memory unit 1 has substantially the same construction as the non-volatile memory unit 100 shown in FIG. 2.

The apparatus for recognizing the state of connection of terminals according to the present invention for recognizing the connecting state of a plurality of terminals 5 of the memory device 6 having the non-volatile memory unit 1 mounted thereto includes a data storage unit 2, disposed inside the memory device 6, for storing connection state recognition data necessary for recognizing the connection state of a plurality of terminals 5; a switching control unit 3 having the function of switching the current state to the state for outputting the connection state recognition data between the non-volatile memory unit 1 and the data storage unit 2; and a data detecting unit 4 for detecting the connection state recognition data outputted from the switching control unit 3 and for confirming whether or not there is any connection fault of a plurality of terminals 5 on the basis of the connection state recognition data detected by the data detecting unit 4.

Here, the connection state recognition data stored in the data storage unit 2 is the data different from the data of other addresses. Further, the switching control unit 3 selects access to the non-volatile memory unit 1 or access to the data storage unit 2 in accordance with the switching control signal Ssc, and makes access to the first address (for example, 0 address), and outputs the data obtained by this access through the data detecting unit 4.

Preferably, the apparatus for recognizing the state of connection of terminals according to the basic embodiment of the present invention is constituted so as to output the predetermined connection state recognition data to at least one of the first address (e.g., 0 address) and the final address, under the state in which a pull-up resistor is connected to each of the address terminals A0 to AN and the data terminals D0 to DM among a plurality of terminals 5 described above. In this case, the data detecting unit 4 can recognize the existence of any terminal or terminals having a connection fault among the address terminals and the data terminals on the basis of this connection state recognition data by making access to the first or final address, when the data detecting unit 4 recognizes the connection state of a plurality of terminals 5.

Preferably, further, when the absence of the connection fault of the data terminals D0 to DM among a plurality of terminals 5 is known in advance in the apparatus for recognizing the state of connection according to the basic embodiment of the present invention, this apparatus is constituted in advance so as to output mutually different connection state recognition data to the areas corresponding to the addresses to which a specific attention is to be paid, under the state in which a pull-up resistor is connected to each of the address terminals A0 to AN of a plurality of terminals 5. In this case, the data detecting unit 4 can specify the address terminal or terminals having the connection fault on the basis of the connection state recognition data by making access to the first or final address.

Preferably, further, the apparatus for recognizing the state of connection of terminals according to the basic embodiment of the present invention is constituted in advance so as to output predetermined connection state recognition data to at least one of the first and final addresses, under the state in which a pull-down resistor is connected to each of the address terminals A0 to AN and the data terminals D0 to DM of a plurality of terminals 5 described above. At this time, when the data detecting unit 4 recognizes the connection state of a plurality of terminals, it can recognize, on the basis of this connection state recognition data, the existence of any terminal or terminals having the connection fault in the address terminal and the data terminals by making access to the first or final address.

Preferably, further, when the absence of the connection fault of the data terminals D0 to DM in a plurality of terminal 5 is known in advance, the apparatus for recognizing the state of connection of terminals according to the basic embodiment of the present invention is constituted in advance so as to output mutually different connection state recognition data to the areas corresponding to the addresses to which a specific attention is to be paid, under the state in which a pull-down resistor is connected to each of the address terminals of a plurality of terminals, or under the state in which no resistor is connected at all. At this time, the data detecting unit 4 can specify the address terminal or terminals having the connection fault on the basis of the connection state recognition data by making access to the first or final address.

On the other hand, a method for recognizing the state of connection of terminals executed by using the terminal connection state recognizing apparatus described above disposes, inside a memory device, a data storage unit for storing connection state recognition data necessary for recognizing the connection state of a plurality of terminals of the memory device having a non-volatile memory unit mounted thereto, and switches the current state to the state for outputting the connection state recognition data between the non-volatile memory unit and the data storage unit, and recognizes the existence or absence of the connection fault of a plurality of terminals on the basis of the connection state recognition data outputted under this state.

Preferably, the method for recognizing the state of connection of terminals of the present invention described above is constituted so as to output in advance predetermined connection state recognition data to at least one of the first and final addresses, under the state in which a pull-up resistor is connected to each of the address terminals and each of the data terminals among a plurality of terminals, and to recognize, on the basis of the connection state recognition data, the terminal or terminals having the connection fault among the address terminals and the data terminals by making access to the first or final address when recognizing the connection state of a plurality of terminals.

Preferably, further, when the absence of the connection fault of the data terminals among a plurality of terminals is known in advance, the method for recognizing the state of connection of terminals described above is constituted so as to output in advance mutually different connection state recognition data to areas corresponding to the address, to which a specific attention is to be paid, under the state in which a pull-up resistor is connected to each of the address terminals among a plurality of terminals, so that the address terminal or terminals having the connection fault can be specified on the basis of the connection state recognition data.

Preferably, further, when a pull-down resistor is connected to each of the address terminals and each of the data terminals among a plurality of terminals, the method for recognizing the state of connection of terminals described above is constituted so as to output in advance predetermined connection state recognition data to at least one of the first and final addresses, under the state in which a pull-down resistor is connected to each of the address terminals and each of the data terminals among a plurality of terminals, and to recognize, on the basis of this connection state recognition data, the existence of the terminals having the connection fault in the address terminals and the data terminals by making access to the first or final address, when recognizing the connection state of a plurality of terminals.

Preferably, further, the method for recognizing the state of connection of terminals described above is constituted so as to output in advance predetermined connection state recognition data to at least one of the first and final addresses, under the state in which a pull-down resistor is connected to each of the address terminals and each of the data terminals among a plurality of terminals, or under the state in which no resistor is connected at all, and to recognize, on the basis of the connection state recognition data, the existence of the terminal or terminals having the connection fault in the address terminals and the data terminals by making access to the first or final address, when recognizing the state of connection of a plurality of terminals.

Preferably, further, when the absence of the connection fault of the data terminals among a plurality of terminals is known in advance, the method for recognizing the state of connection of terminals described above is constituted so as to output in advance mutually different connection state recognition data to corresponding areas of the addresses to which a specific attention is to be paid, under the state in which a pull-down resistor is connected to each of the address terminals among a plurality of terminals, or under the state in which no resistor is connected at all, and to specify the address terminal or terminals having the connection fault on the basis of the connection state recognition data by making access to the first or final address.

The apparatus for recognizing the state of connection of terminals according to the basic embodiment can reliably detect the connection fault of a plurality of terminals inclusive of the address terminals and the data terminals, without rewriting the existing data of the non-volatile memory unit inside the memory device, such as a small size memory card.

Particularly, the connection fault of the address terminals and the data terminals among a plurality of terminals can be easily recognized with a minimum necessary memory area by making access to the data of the first or final address in the connection state recognition data inside the data storage unit. When the occurrence of the connection fault is confirmed in the address terminals and the data terminals as a result of the detection of the connection state recognition data of the first or final address, the memory device is connected again so as to output the existing data inside the non-volatile memory unit, or the address terminals as well as the data terminals are repaired, in order to prevent an erroneous operation of the computer system. After this process, the memory device inclusive of the non-volatile memory unit storing the existing data can be used once again.

FIGS. 4 and 5 are block diagrams Nos. 1 and 2 showing a configuration of the preferred embodiment of the present invention. Generally, as typical examples of the memory device 6 (see FIG. 3) used for the computer system, a small size memory card to which a non-volatile memory unit 1 is mounted, a memory board to which the non-volatile memory unit 1 is mounted, a portable terminal to which the non-volatile memory unit 1 is mounted, and so forth, can be mentioned. However, in this embodiment, the small size memory card 60 having the non-volatile memory unit 1 mounted thereto will be hereby illustrated.

Referring to FIG. 4, the memory card 60 to which the data storage unit 2 (see FIG. 5) according to the present invention is mounted together with the non-volatile memory unit 1, is assembled into an adapter 7 of an industrial standard form. This adapter 7 has an interface function which allows access to a personal computer 40. Further, the non-volatile memory unit 1 stores the data on the user side and is preferably constituted by a flash memory, or the like. The data storage unit 2 is disposed for storing the connection state recognition data necessary for recognizing the connection state of a plurality of terminals 5 (address terminals A0 to AN, data terminals D0 to DM (e.g., M=15), control terminals and other terminals) extended from the memory device card 60.

In FIG. 4, further, there is shown disposed a switching control signal generating unit 30 for outputting a switching control signal Ssc for switching the connection state recognition data to the accessible state from the data storage unit 2 by using the external terminal CH, as the switching control unit 3 of the present invention (see FIG. 3). This switching control signal generating unit 30 is connected preferably to the data storage unit 2 through a NOT circuit 22 having a buffer function.

In FIG. 4, further, the data detecting unit 4 of the present invention is accomplished by a personal computer 40 for confirming the existence or absence of the connection fault of a plurality of terminals 5, on the basis of the connection state recognition data which is accessed by using the switching control signal Ssc. Further, the switching control signal generating unit 30 can be constituted by the personal computer 40.

When the non-volatile memory unit 1, such as a flash memory, is used for the computer system, a memory card 60 having the industrial standard form can be achieved by fitting the small size memory card 60 having this non-volatile memory unit 1 mounted thereto into the adapter 7. Generally, however, because the non-volatile memory unit 1 is fitted into the memory card 60, there might be the case in which a plurality of terminals extended from this non-volatile memory unit 1 cannot be perfectly connected. Further, a plurality of terminals 5 extended from the memory card 60 are formed in the connector portion 70 at the end of the adapter 7. Since the connector portion 70 might be worn out, there remains the possibility that all the connectors of the connector portion 70 are not always perfectly connected, when the connector portion 70 is fitted into the socket portion 8 provided in the personal computer 40.

To cope with such disadvantages, a preferred embodiment of the present invention includes the data storage unit 20 for storing the connection state recognition data for recognizing the connection state of a plurality of terminals 5 inside the memory card 60 as shown in FIG. 5.

Preferably, the data storage unit 2 includes the connection state recognition data storage unit 20 for storing in advance the connection state recognition data for confirming the existence or absence of the connection fault of the address terminals and the data terminals; and an address decoder 24 for designating a specific address in the memory area inside the connection state recognition data storage unit 20.

The explanation will be given in further detail. In the embodiment shown in FIG. 5, the portion of the connection state recognition data inside the connection state recognition data storage unit 20 is allowed to be accessed, in accordance with the switching control signal Ssc sent from the external terminal CH. Typically, when a pull-up resistor is connected to each of the address terminals (A0 to A4) and the data terminals (D0 to D15) to establish the pulled-up state, the connection state of the address terminals and the data terminals can be easily recognized by recognizing the data of the first address, such as the 0 address.

In a normal operation of the computer system, the switching control signal Ssc of the "H (high)" level is applied from the personal computer 40 or the like, to the external terminal CH, and the memory card 60 is used under the state in which a normal data write operation and a normal data erase operation are executed for the non-volatile memory unit 1.

When the switching control signal Ssc of the "L (low)" level is applied to the external terminal CH, on the other hand, access is made to the portion of the connection state recognition data inside the connection state recognition data storage unit 20. When the access for the data read operation is executed to the first address, such as the 0 address at this time, it becomes possible to confirm whether or not any connection fault exists in the address terminals and the data terminals on the basis of the data read out from this 0 address. When the connection fault, such as the open fault, exists in terminals other than the address terminals and the data terminals, it is necessary to satisfy the condition in which the normal read state is established by the pull-up resistor or the pull-down resistor.

Preferably, the method for recognizing the state of connection of terminals in the present invention is executed by switching the current state to the state for outputting the connection state recognition data between the non-volatile memory unit 1 including the flash memory, etc., and the data storage unit 2 including the connection state recognition data storage unit 20, etc., by using the apparatus for recognizing the state of connection of terminals according to the embodiment described above, and by confirming the existence or absence of the connection fault of a plurality of terminals 5, on the basis of the connection state recognition data outputted under the above state.

Here, the data for confirming the existence or absence of the connection fault of the address terminals or the data terminals when the pull-up resistor is connected to each address terminal and each data terminal, are again tabulated in the following Table 1.

TABLE 1

Data for confirming the existence or absence of
address terminals or data terminals when pull-up
resistor is connected to each address terminal and
each data terminal

| address | (address) | | | | data |
|---|---|---|---|---|---|
| | A3 | A2 | A1 | A0 | |
| 0 | 0 | 0 | 0 | 0 | (FFFF)h |
| 1 | 0 | 0 | 0 | 1 | (0000)h |
| 2 | 0 | 0 | 1 | 0 | (0000)h |
| 3 | 0 | 1 | 0 | 0 | (0000)h |
| 4 | 1 | 0 | 0 | 0 | (0000)h |

As shown in Table 1, the data (FFFF)h (where h represents a hexadecimal data and F represents "15" in the hexadecimal notation) outputted when the terminal connection state is normal, is allowed in advance to be read out at the 0 address. On the other hand, the data (0000)h outputted when a connection fault of a terminal exists, is allowed in advance to be read out at other addresses (for example, addresses 1 to 4).

Here, if the data (FFFF)h is outputted when the data of the 0 address is accessed, the data "0" (the data of the "L" level) is outputted for all the address terminals. Therefore, the terminal connection state is judged as normal. On the other hand, if the (0000)h data is outputted when the data of the 0 address is accessed, a probability of the connection fault, such as the open fault of the address terminals, is high. For, the case in which the (0000)h data is outputted is only the case in which all the data terminals have a connection fault, and such a probability is extremely low.

Further, if the data other than those tabulated in Table 1 is outputted when the data of the 0 address is accessed, a part of the data terminals is judged to have the connection fault.

When the existence or absence of the connection fault between the non-volatile memory unit 1 and the memory card 60 is confirmed in the embodiment described above, however, a pull-up resistor, which generates the data "1" ("H" level data) at the time of the open fault must be added to the side closer to the personal computer than to this connection fault recognition position.

The data for confirming the existence or absence of the connection fault of the address terminals or the data terminals when the pull-down resistor is connected to each address terminal and each data terminal or when no resistor is connected at all, are tabulated in the following Table 2.

TABLE 2

Data for confirming the existence or absence of
connection fault of address terminals or data
terminals when pull-down resistor is connected to
each address terminal and each data terminal

| address | (address) | | | | data |
|---|---|---|---|---|---|
| | A3 | A2 | A1 | A0 | |
| 0 | 0 | 0 | 0 | 0 | (FFFF)h |
| 1 | 0 | 0 | 0 | 1 | (0000)h |
| 2 | 0 | 0 | 1 | 0 | (0000)h |
| 3 | 0 | 1 | 0 | 0 | (0000)h |
| 4 | 1 | 0 | 0 | 0 | (0000)h |

In this case, too, the data (FFFF)h outputted when the terminal connection state is normal, is allowed, in advance, to be read out at the 0 address in the same way as the case described above in which the pull-up resistor is connected. On the other hand, the data (0000)h outputted when the connection fault of the terminals exists, is also allowed in advance to be read out at other addresses (for example, 1 to 4 addresses). It should be noted in this case, however, that the relationship between the "H" level and the "L" level of the data is reversed in comparison with the case described above in which the pull-up resistor is connected.

If the data (FFFF)h is outputted when the data of the 0 address is accessed, the data "0" (data of the "H" level) is outputted to all the address terminals. Therefore, the terminal connection state is judged as normal. If the data (0000)h is outputted when the data of the 0 address is accessed, on the other hand, a probability of the connection fault, such as the open fault of the address terminals, is high.

Further, if the data other than those described in Table 2 is outputted when the data of the 0 address is accessed, a part of the data terminals is judged to have the connection fault in the same way as the case of Table 1.

Incidentally, the data of the 0 address is accessed in either case in which the pull-up resistor or the pull-down resistor is connected to each of the address terminals and the data terminals, and the existence or absence of the connection fault of the address terminals or the data terminals can be confirmed by gaining access to the final address (for example, the F address), in place of the 0 address.

Even when the data illustrated in Tables 1 and 2 are used, it is not possible to concretely identify the address terminals having the connection fault. However, if it is known in advance that the data terminals do not have the connection fault, that is, when all the data terminals are normally connected, the connection state recognition data is stored in advance in the connection state recognition data storage unit 20 shown in FIG. 5, so that mutually different connection state recognition data can be outputted to the areas corresponding to the addresses to which a specific attention is to be paid, under the state in which the pull-up resistor or the pull-down resistor is connected to each of the address terminals and the data terminals. According to this arrangement, the address terminal having the connection fault, such as the open fault, enters the pulled-up state or the pulled-down state when the 0 address or the final address is accessed, and the address terminal having the connection fault can be specified by detecting the data selected when data "1" is set in this terminal (for example, output data B to D).

A concrete method for specifying the address terminal having the connection fault when the normal connection of the data terminals is recognized in the case in which the pull-up resistors are connected to the data terminals and the address terminals (or when the pull-down resistors are connected or when no resistor is connected at all), is tabulated in the following Table 3.

TABLE 3

Method for specifying address terminal having
connection fault when connection of data terminal is
confirmed as normal with pull-up resistors connected
to data terminals and address terminals

- when no fault exists → data A is selected
- when A0 has open fault → output data B is selected
- when A1 has open fault → output data C is selected
- when A2 has open fault → output data D is selected TABLE 3-continued Method for specifying address terminal having
connection fault when connection of data terminal is
confirmed as normal with pull-up resistors connected
to data terminals and address terminals

- when AN has open fault → data prepared in advance is selected
- data of 0 address (e.g. data of A to D) is accessed
- each is unique data As tabulated in Table 3, the output data A which is selected when the connection state of the address terminal is normal, is held at the address of the 0 address. On the other hand, unique data (e.g. output data B to output data D) which is selected so as to correspond to the address terminal having the connection fault, is held at the addresses other than the 0 address.

Here, when the data of the 0 address is accessed and when no connection fault of the address terminal is found out, the output data A is selectively read out. When the address terminal A0 has the connection fault, on the other hand, the output data B is selectively read out. Further, when the address terminal A1 has the connection fault, the output data C is selectively read out. Furthermore, when the address terminal A2 has the connection fault, the output data D is selectively read out. In this way, when an arbitrary address terminal AN has the connection fault, the unique data that is prepared in advance is read out, and the address terminals having the connection fault can be discriminated. It should be noted in this case, however, that the corresponding data is selected at the address terminal when a short circuit occurs between the write enable terminal WE, which is at the "H" level at the time of read operation of the data, or the high voltage side power source Vcc, and this address terminal, too.

Figure 7A:
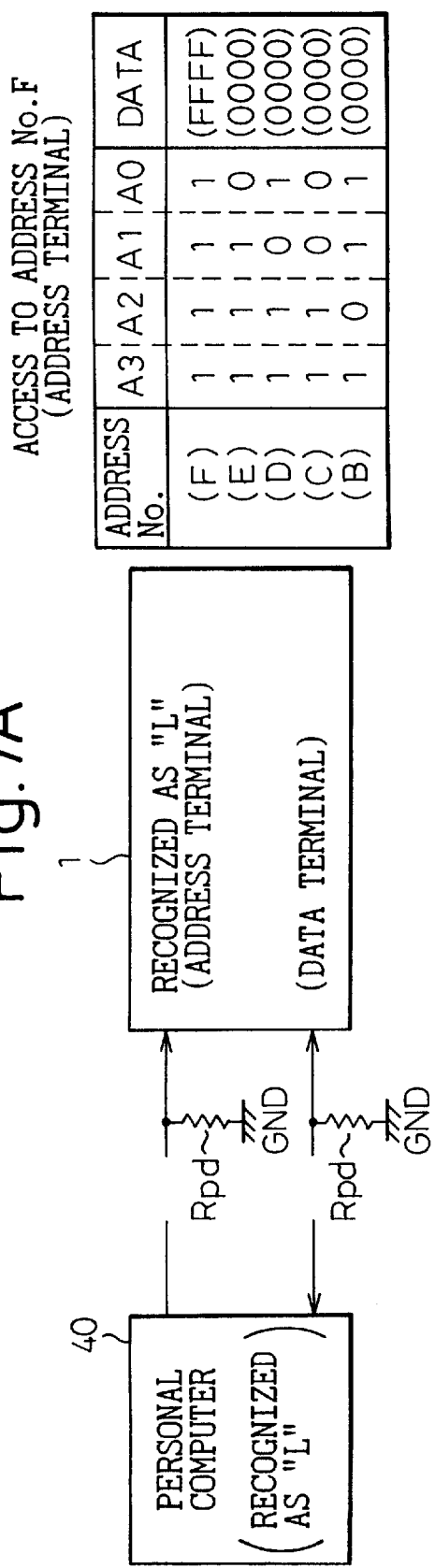
FIGS. 7A and 7B are explanatory views useful for explaining an example of the open fault when a pull-down resistor is connected to each terminal.
Figure 7B:
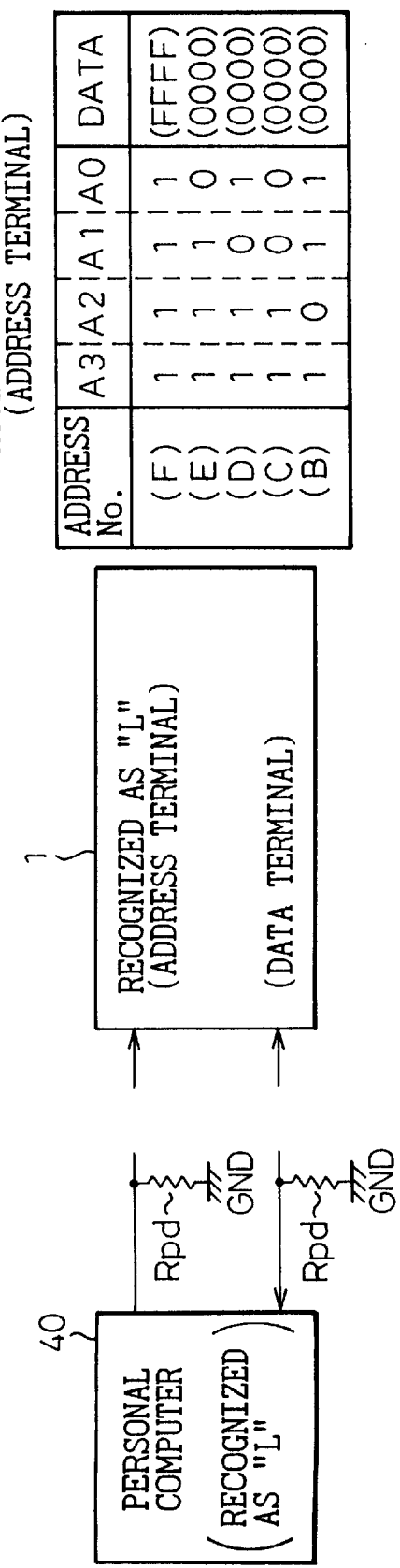

FIGS. 6A and 6B are explanatory views useful for explaining the example for detecting the open fault when the pull-up resistor is connected to each of the data terminals and the address terminals, and FIGS. 7A and 7B are explanatory views useful for explaining the open fault when the pull-down resistor is connected to each of the terminals described above.

FIG. 6A shows the example when the open fault is detected when the connection fault, such as the open fault, occurs in a position closer to the personal computer 40 than to the position connected to the high voltage side power source Vcc through the pull-up resistor Rpu. Here, the data of the address terminal in which the open fault occurs is recognized as the "H" level inside the non-volatile memory unit 1. When a similar open fault occurs in the data terminal, on the other hand, the high voltage is not supplied through the pull-up resistor Rpu, so that the data is detected as the "L" level data inside the personal computer 40. The data which are read out under the above state when the 0 address is accessed are altogether shown in the table on the upper right side of the drawing. It can be appreciated clearly from this table that if the (FFFF) data is outputted when the 0 address is accessed, the connection state of the address terminal is judged as normal, and when the (0000) data is outputted, the open fault is judged to have occurred in the address terminal or the data terminal.

FIG. 6B shows the example for detecting the open fault when the connection fault such as the open fault occurs in a position closer to the memory card inclusive of the non-volatile memory unit 1 than to the position in which the high voltage side power source Vcc is connected through the pull-up resistor Rpu. Here, the data of the address terminal in which the open fault occurs is recognized as the "L" level inside the non-volatile memory unit 1, because the high voltage is not supplied through the pull-up resistor Rpu. When a similar open fault occurs in the data terminal, on the other hand, the data is detected as the "H" level data inside the personal computer 40. In such a case, the data read out when the final address (for example, the F address) is accessed are altogether tabulated in the table on the lower right side of the drawing. It can be appreciated clearly from this table that when the F address is accessed, the connection state of the address terminal is judged as normal if the (0000) data is outputted, and the address terminal or the data terminal is judged to have the open fault if the (FFFF) data is outputted.

Further, FIG. 7A shows an example for detecting the open fault when the connection fault, such as the open fault, occurs in a position closer to the personal computer than to the position in which the low voltage side power source (for example, the ground GND) through the pull-down resistor Rpd. Here, the data of the address terminal in which the open fault occurs is recognized as the "L" level inside the non-volatile memory unit 1. When a similar open fault occurs in the data terminal, on the other hand, the "H" level data is not transferred from the non-volatile memory unit 1 to the personal computer 40, so that the data is detected as the "L" level data inside the personal computer 40. The data which are read out when the 0 address is accessed under the above state are altogether tabulated in the table on the upper right side of the drawing. It can be appreciated clearly from this table that when the F address is accessed, the connection state of the address terminal is judged as normal if the (FFFF) data is outputted, and the open fault of the address terminal or the data terminal is judged to have occurred if the (0000) data is outputted.

Further, FIG. 7B shows an example for detecting a connection fault when the connection fault, such as the open fault, occurs in a position closer to the memory card inclusive of the non-volatile memory portion than to the position which is connected to the low voltage side power source through the pull-down resistor Rpd. In this case, since the "H" level data is not transferred from the personal computer 40 to the non-volatile memory unit 1, the data of the address terminal in which the open fault occurs is recognized as the "L" level data inside the non-volatile memory unit 1. When a similar open fault occurs in the data terminal, on the other hand, the data is detected as the "L" level data inside the personal computer 40. The data read out when the final address (for example, the F address) is accessed in the above case are altogether tabulated in the table on the lower right side of the drawing. It can be appreciated clearly from this table that if the (FFFF) data is outputted when the F address is accessed, the connection state of the address terminal is judged as normal, and if the (0000) data is outputted, the open fault is judged to have occurred in the address terminal or the data terminal.

The following Table 4 illustrates the general relationship between the data and address terminals and the data detection modes shown in FIGS. 6A to 7B in order to more clearly represent the correlationship between the connection fault of the data and address terminals and the data that is read out. Further, the following Table 5 illustrates four kinds of data detection modes selected from Table 4.

TABLE 4

General relationship between data and address terminals and data detection modes shown in FIGS. 6A to 7B

| personal computer (data terminal) | non-volatile memory unit (address terminal) | data detection mode |
|---|---|---|
| recognized as L | recognized as L | No. 1 |
| recognized as L | recognized as H | No. 2 |
| recognized as H | recognized as L | No. 3 |
| recognized as H | recognized as H | No. 4 |

TABLE 5

Four kinds of data detection modes selected by Table 4

[No. 1]
F (final) address is accessed:

| address | (address) | | | | data |
|---|---|---|---|---|---|
| | A3 | A2 | A1 | A0 | |
| (F) | 1 | 1 | 1 | 1 | (FFFF) |
| (E) | 1 | 1 | 1 | 0 | (0000) |
| (D) | 1 | 1 | 0 | 1 | (0000) |
| (C) | 1 | 1 | 0 | 0 | (0000) |
| (B) | 1 | 0 | 1 | 1 | (0000) |

[No. 2]
F (final) address is accessed:

| address | (address) | | | | data |
|---|---|---|---|---|---|
| | A3 | A2 | A1 | A0 | |
| (F) | 1 | 1 | 1 | 1 | (0000) |
| (E) | 1 | 1 | 1 | 0 | (FFFF) |
| (D) | 1 | 1 | 0 | 1 | (FFFF) |
| (C) | 1 | 1 | 0 | 0 | (FFFF) |
| (B) | 1 | 0 | 1 | 1 | (FFFF) |

[No. 3]
0 address is accessed:

| address | (address) | | | | data |
|---|---|---|---|---|---|
| | A3 | A2 | A1 | A0 | |
| (0) | 0 | 0 | 0 | 0 | (FFFF) |
| (1) | 0 | 0 | 0 | 1 | (0000) |
| (2) | 0 | 0 | 1 | 0 | (0000) |
| (3) | 0 | 1 | 0 | 0 | (0000) |
| (4) | 1 | 0 | 0 | 0 | (0000) |

[No. 4]
0 address is accessed:

| address | (address) | | | | data |
|---|---|---|---|---|---|
| | A3 | A2 | A1 | A0 | |
| (0) | 0 | 0 | 0 | 0 | (0000) |
| (1) | 0 | 0 | 0 | 1 | (FFFF) |
| (2) | 0 | 0 | 1 | 0 | (FFFF) |
| (3) | 0 | 1 | 0 | 0 | (FFFF) |
| (4) | 1 | 0 | 0 | 0 | (FFFF) |

As tabulated in Table 4, four kinds of data detection modes (No. 1, No. 2, No. 3 and No. 4) can be conceived, depending on the combinations of the level ("L" or "H") of the data recognized as the connection fault of the data terminal inside the personal computer 40 and the level ("L" or "H") of the data recognized as the connection fault of the address terminals inside the non-volatile memory unit 1.

In the data detection mode No. 1 shown in Table 5, both of the connection fault of the data terminal and the connection fault of the address terminal are recognized as the "L" level data. When the F address is accessed in this case, the connection state of the address terminal is judged as normal when the (FFFF) data is outputted, and the connection fault such as the open fault of the address terminal or the data terminal is judged to have occurred when the (0000) data is outputted.

In the data detection mode No. 2 shown in Table 5, the connection fault of the data terminal is recognized as the data of the "L" level while the connection fault of the address terminal is recognized as the data of the "H" level. When the F is accessed in this case, the connection state of the address terminal is judged as normal if the (0000) data is outputted, and the connection fault, such as the open fault, is judged to have occurred in the address terminal or the data terminal when the (FFFF) data is outputted.

In the data detection mode No. 3 shown in Table 5, further, the connection fault of the data terminal is recognized as the data of the "H" level while the connection fault of the address terminal is recognized as the data of the "L" level. When the 0 address is accessed in this case, the connection state of the address terminal is judged as normal if the (FFFF) data is outputted, and the connection fault such as the open fault is judged to have occurred in the address terminal or the data terminal if the (0000) data is outputted.

In the data detection mode No. 4 shown in Table 5, both of the connection fault of the data terminal and the connection fault of the address terminal are judged as the data of the "H" level. When the 0 address is accessed in this case, the connection state of the address terminal is judged as normal if the (0000) data is outputted, and the connection fault, such as the open fault, is judged to have occurred at the address terminal or the data terminal if the (FFFF) data is outputted.

In the embodiment described above, the information on the connection state of a plurality of terminals including both the address and data terminals is processed and displayed by the personal computer, but any other processing means may be employed, as well, so long as they can recognize and output those signals which represent such information.

According to typical embodiments of the present invention as described above, in the first place, the data storage unit storing in advance the connection state recognition data of a plurality of terminals of the memory device inclusive of the non-volatile memory unit, is first disposed inside the memory device, and the connection state recognition data inside this data storage unit can be accessed by changing the connection state of a plurality of terminals by switching the external terminals, etc. Therefore, the connection fault of a plurality of terminals can be detected reliably without rewriting the existing data of the non-volatile memory unit. As a result, the present invention can prevent erroneous operations of the computer system and greatly contributes to an improvement in reliability of the computer system.

According to typical embodiments of the present invention, in the second place, access is made to the connection state recognition data of the first address or the final address inside the data storage unit under the state in which the pull-up resistor or the pull-down resistor is connected to each of the address terminals and the data terminals among a plurality of terminals of the memory device. Therefore, the connection fault of both of the address terminals and the data terminals among a plurality of terminals can be confirmed simply with the minimum necessary memory area, and without rewriting the existing data of the non-volatile memory unit. When the connection fault is recognized to have occurred in the address terminals and the data terminals by such a connection state recognition data, the present invention again connects the memory device in such a manner as to output the existing data inside the non-volatile memory unit, or to repair the address terminals and the data terminals. For this reason, the present invention can prevent erroneous operations of the computer system.

In the third place, according to typical embodiments of the present invention, when the absence of the connection fault of the data terminals among a plurality of terminals of the memory device is known in advance, the present invention employs the arrangement so that mutually different connection state recognition data is outputted in advance to the corresponding areas of those addresses to which a specific attention is to be paid, and the address terminals having the connection fault can be easily specified, on the basis of the connection state recognition data, by making access to the connection state recognition data of the first address or the final address.

I claim:

1. An apparatus for recognizing the state of connection of terminals, for recognizing the connection state of a plurality of terminals of a memory device having a non-volatile memory unit mounted thereto, comprising:

a data storage unit disposed inside said memory device, for storing connection state recognition data necessary for recognizing a connection state of a plurality of said terminals;

a switching control unit having the function of switching the current state to the state for outputting said connection state recognition data between said non-volatile memory unit and said data storage unit; and a data detecting unit for detecting said connection state recognition data outputted from said switching control unit, and confirming whether or not there is any connection fault of a plurality of said terminals on the basis of said connection state recognition data.

2. An apparatus for recognizing the state of connection of terminals, according to claim 1, wherein predetermined one of said connection state recognition data is allowed in advance to be outputted to at least one of the first address and the final address, under the state in which a pull-up resistor is connected to each of said address terminals and said data terminals among a plurality of said terminals, and wherein the existence of a terminal or terminals having the connection fault is recognized, on the basis of said connection state recognition data, by making access to said first address or the final address when said data detecting unit recognizes the connection state of a plurality said terminals.

3. An apparatus for recognizing the state of connection of terminals, according to claim 1, wherein, when the absence of the connection fault of the data terminals among a plurality of said terminals is known in advance, mutually different connection state recognition data is allowed in advance to be outputted to areas corresponding to the addresses to which a specific attention is to be paid, under the state in which a pull-up resistor is connected to each of the address terminals among a plurality of said terminals, so that the address terminal or address terminals having the connection fault can be specified, on the basis of said connection state recognition data, when said data detecting unit makes access to the first address or the final address.

4. An apparatus for recognizing the state of connection of terminals, according to claim 1, wherein predetermined one of said connection state recognition data is allowed in advance to be outputted to at least one of the first address and the final address under the state in which a pull-down resistor is connected to each of the address terminals and the data terminals among a plurality of said terminals, or under the state in which no resistor is connected at all, and wherein the existence of the terminal or terminals having the connection fault in said address terminals and said data terminals can be recognized, on the basis of said connection state recognition data, when said data detecting unit makes access to the first address or the final address when recognizing the connection state of a plurality of said terminals.

5. An apparatus for recognizing the state of connection of terminals, according to claim 1, wherein the address terminal having the connection fault can be specified on the basis of said connection state recognition data when said data detecting unit makes access to the first address or the final address.

6. A method for recognizing the state of connection of terminals, for recognizing the state of connection of a plurality of terminals of a memory device having a non-volatile memory unit mounted thereto, including the steps of:

disposing a data storage unit for storing connection state recognition data necessary for recognizing a connection state of a plurality of said terminals inside said memory device;

switching the current state to the state for outputting said connection state recognition data between said non-volatile memory unit and said data storage unit; and confirming whether or not there is any connection fault of a plurality of said terminals on the basis of said connection state recognition data outputted under said state.

7. A method for recognizing the state of connection of terminals, according to claim 6, wherein predetermined one of said connection state recognition data is allowed in advance to be outputted to at least one of the first address and the final address, under the state in which a pull-up resistor is connected to each of the address terminals and the data terminals among a plurality of said terminals, so that the existence of a terminal having the connection fault in the address terminals and the data terminals can be recognized, on the basis of said connection state recognition data, by making access to the first address or the final address when the connection state of a plurality of said terminals is recognized.

8. A method for recognizing the state of connection of terminals, according to claim 6, wherein, when the absence of the connection fault of the data terminals among a plurality of said terminals is known in advance, mutually different connection state recognition data is allowed in advance to be outputted to areas corresponding to the addresses to which a specific attention is to be paid, under the state in which a pull-up resistor is connected to each of the address terminals among a plurality of said terminals, so that the address terminal having the connection fault can be specified on the basis of said connection state recognition data by making access to the first address or the final address.

9. A method for recognizing the state of connection of terminals, according to claim 6, wherein predetermined one of said connection state recognition data is allowed in advance to be outputted to at least one of the first address and the final address, under the state in which a pull-down resistor is connected to each of the address terminals and the data terminals among a plurality of said terminals, so that a terminal having the connection fault in the address terminals and the data terminals can be specified, on the basis of said connection state recognition data, by making access to the first address or the final address when the connection state of a plurality of said terminals is recognized.

10. A method for recognizing the state of connection of terminals, according to claim 6, wherein, when the absence of the connection fault of the data terminals among a plurality of said terminals is known in advance, mutually different connection state recognition data is allowed in advance to be outputted to areas corresponding to the addresses to which a specific attention is to be paid, under the state in which a pull-down resistor is connected to each of the address terminals among a plurality of said terminals, or under the state in which no resistor is connected at all, so that the address terminal having the connection fault can be specified, on the basis of said connection state recognition data, by making access to the first address or the final address.

11. A memory device having a plurality of terminals and including a non-volatile memory mounted thereto, comprising:
   a data storage unit disposed in said memory device, for storing data when testing a connection state of the plurality of said terminals; and
   a switching control unit having the function such that when testing, said switching control unit controls to connect the plurality of said terminals with said data storage unit, when non testing, said switching control unit controls to connect the plurality of said terminals with said non-volatile memory.

* * * * *